United States Patent
Zhang et al.

(10) Patent No.: US 9,690,419 B2
(45) Date of Patent: Jun. 27, 2017

(54) GATE DRIVING CIRCUIT AND A DRIVING METHOD THEREOF, AS WELL AS A DISPLAY DEVICE

(71) Applicant: BOE TECHNOLOGY GROUP CO., LTD., Beijing (CN)

(72) Inventors: Yuanbo Zhang, Beijing (CN); Jiayang Zhao, Beijing (CN); Seungwoo Han, Beijing (CN); Xiangxiang Zou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/435,739

(22) PCT Filed: Jul. 31, 2014

(86) PCT No.: PCT/CN2014/083403
§ 371 (c)(1),
(2) Date: Apr. 14, 2015

(87) PCT Pub. No.: WO2015/143813
PCT Pub. Date: Oct. 1, 2015

(65) Prior Publication Data
US 2017/0010731 A1  Jan. 12, 2017

(30) Foreign Application Priority Data
Mar. 27, 2014 (CN) .......................... 2014 1 0117750

(51) Int. Cl.
*G06F 3/045* (2006.01)
*G06F 3/041* (2006.01)
(Continued)

(52) U.S. Cl.
CPC ............ *G06F 3/0416* (2013.01); *G06F 3/041* (2013.01); *G06F 3/044* (2013.01); *G06F 3/0412* (2013.01);
(Continued)

(58) Field of Classification Search
None
See application file for complete search history.

(56) References Cited

U.S. PATENT DOCUMENTS

| | | | |
|---|---|---|---|
| 2009/0175405 A1 | 7/2009 | Chen et al. | |
| 2011/0012823 A1 | 1/2011 | Tsai et al. | |
| 2013/0241814 A1* | 9/2013 | Hirabayashi | G09G 3/3677 345/100 |

FOREIGN PATENT DOCUMENTS

| | | |
|---|---|---|
| CN | 101178939 | 7/2010 |
| CN | 102012591 | 4/2011 |

(Continued)

OTHER PUBLICATIONS

Chinese Office Action with English Language Translation, dated Jan. 5, 2016, Chinese Application No. 201410117750.7.
(Continued)

*Primary Examiner* — Ilana Spar
*Assistant Examiner* — Kirk Hermann
(74) *Attorney, Agent, or Firm* — Blakely Sokoloff Taylor & Zafman LLP (57) ABSTRACT

The present disclosure provides a gate driving circuit and a driving method thereof, a display device, which relates to the field of display technology. The gate driving circuit may comprise a plurality of mutually cascaded shift register units and a pre-charging unit, the gate row drive scanning and touch control scanning of the plurality of mutually cascaded shift register units are performed alternately. By additionally arranging a pre-charging unit connected with the corre-
(Continued)

sponding first stage of shift register unit when the gate row drive scanning is performed again after the touch control scanning is accomplished, the first stage of shift register unit can be pre-charged during the touch control scanning.

15 Claims, 4 Drawing Sheets

(51) Int. Cl.
  *G11C 19/28* (2006.01)
  *G09G 3/36* (2006.01)
  *G06F 3/044* (2006.01)
  *G09G 3/20* (2006.01)
(52) U.S. Cl.
  CPC ........... *G09G 3/3677* (2013.01); *G11C 19/28* (2013.01); *G06F 2203/04104* (2013.01); *G09G 3/20* (2013.01); *G09G 2310/0286* (2013.01); *G09G 2310/065* (2013.01)

(56) References Cited

FOREIGN PATENT DOCUMENTS

| | | |
|---|---|---|
| CN | 102314828 | 1/2012 |
| CN | 102708778 | 10/2012 |
| CN | 103943055 | 7/2014 |
| CN | 103943083 | 7/2014 |
| CN | 203746393 | 7/2014 |

OTHER PUBLICATIONS

International Search Report with English Language Translation, dated Jan. 5, 2015, Application No. PCT/CN2014/083403.
Chinese Office Action with English Language Translation, dated Aug. 19, 2015, Chinese Application No. 201401177507.
Office Action in Chinese Application No. 201410117750.7 dated Jun. 27, 2016, with English translation. 6 pages.

\* cited by examiner

GATE DRIVING CIRCUIT AND A DRIVING METHOD THEREOF, AS WELL AS A DISPLAY DEVICE

FIELD OF THE INVENTION

The present invention relates to the field of display technology, particularly to a gate driving circuit and a driving method thereof, as well as a display device.

BACKGROUND OF THE INVENTION

With the growing popularization of touch control display devices, people's requirement on quality of the touch control display devices becomes higher and higher. The in-cell touch technology has been widely used for its advantages of reduced thickness and high touch sensitivity and the like.

The in-cell touch technology, i.e., the touch control element, is integrated in the display panel, so that the panel itself has the touch function, and the touch effect and application can be achieved without fitting and assembling with the touch panel additionally. Taking the typical thin film transistor-liquid crystal display (TFT-LCD) as the example, its characteristic is that the manufacture of the touch sensing element is accomplished in the standard manufacturing process of the TFT-LCD, since it does not need to arrange a touch panel additionally, the problem of fitting and alignment does not exist, the weight and the thickness are also reduced significantly, the product will be lighter and thinner. Since the in-cell technology is adopted, the display device product does not need frames, the total plane design can be achieved, the design of the product is also more concise and the application field is wider.

The current in-cell touch technology generally uses the projection type multi-point capacitive touch control mode, the touch control signals thereof are collected through two layers of signal lines, one layer of signal lines thereof are driving lines (Tx lines), the other layer of signal lines serve as sensing lines (Rx lines), the two layers of lines are perpendicular to each other. In the way of implementation, the scanning mode is used to drive each driving line, and the sensing line that intersects with this driving line is measured whether capacitive coupling phenomenon occurs at a certain point. The accurate touch point position can be obtained by scanning one by one, and multi-point touch control can be achieved.

For the current touch control display device, when the pixels and the scanning lines located in the same line or column are charged simultaneously, mutual interference may occur, so the processes of pixel charging and scanning are generally performed separately. Specifically, there are generally two timing modes of V-Blank and H-Blank within one frame. The V-Blank mode means that after all the pixels are charged within one frame, a period of time is left for performing touch control signal scanning, i.e., the pixel charging and the touch control scanning are performed separately. Such a mode can only support the touch control scanning refresh rate which is the same as the display screen refresh rate (in a relationship of 1:1). If the screen refresh rate is 60 HZ, the touch control scanning refresh rate can only be 60 HZ. In order to improve touch sensitivity, increasing the frequency of the touch control scanning is the key, when pursuing experience effect of high performance touch control, the touch refresh rate of 120 HZ and above is necessary.

Figure 1:
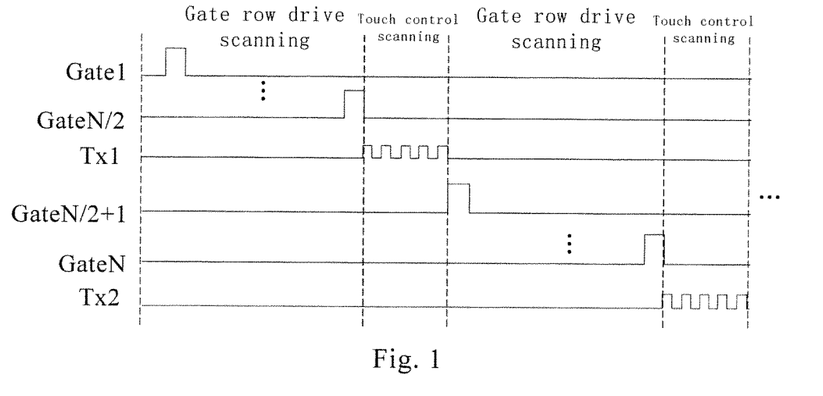
FIG. 1 is a structural schematic view of timing of the in-cell touch control scanning using the H-Blank mode to realize twice of the display refresh frequency in the prior art.

Whereas the H-Blank mode can increase the touch control scanning refresh rate effectively, this mode preserves a period of time for performing partial touch signal scanning within one frame in the interval of charging a certain number of lines of pixels, i.e., the pixel charging and the touch control scanning are performed alternately, such a mode can support the touch control scanning refresh rate to be larger than the screen refresh rate, i.e., in multiple relationship with the screen refresh rate. The in-cell touch control scanning timing using the H-Blank mode to realize twice of the display refresh frequency may be as shown in FIG. 1, by dividing the display scanning into two sections equally, after the end of each section, the operation of pixel scanning GOA (Gate Drive on Array) circuit is paused, a scanning (Tx scanning) is performed to all the touch control sensing lines, therefore, within one display scanning, the touch control scanning can be accomplished twice, a touch control scanning that is twice of the display refresh frequency can be achieve.

Figure 2:
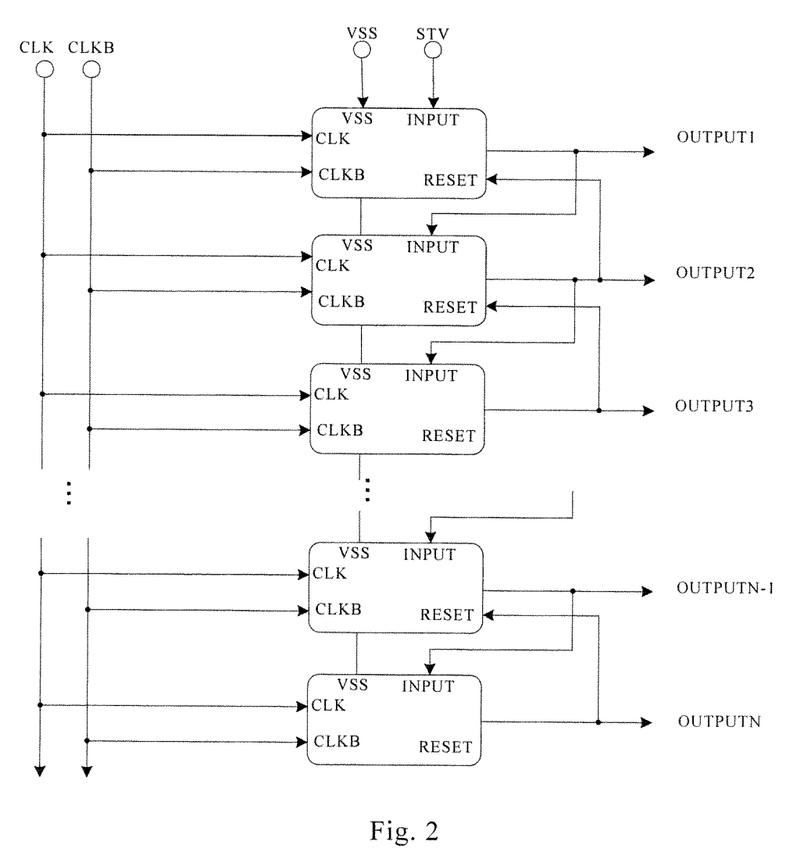
FIG. 2 is a structural schematic view of a gate driving circuit in the prior art.
Figure 3:
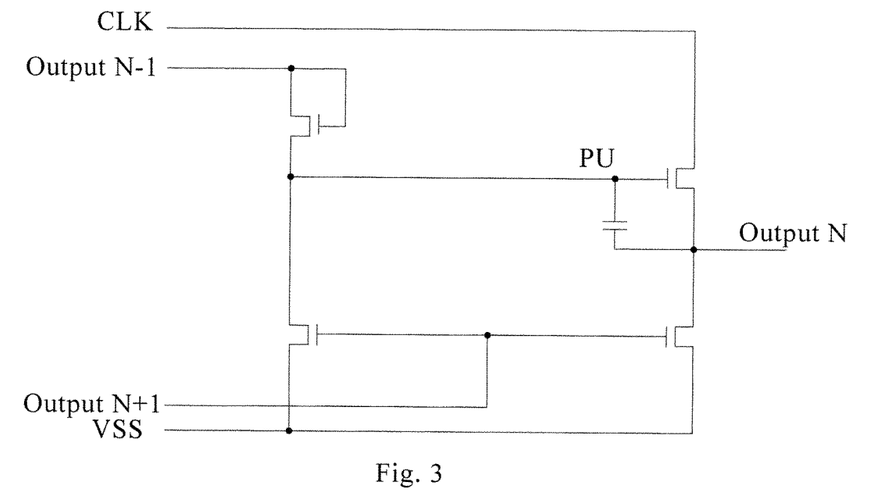
FIG. 3 is a structural schematic view of a shift register unit in a gate driving circuit in the prior art.

The conventional GOA circuit generally comprises a plurality of cascaded shift register units, the structure thereof may be as shown in FIG. 2, wherein each shift register unit is connected with a shift register unit in the neighboring row respectively, each shift register unit corresponds to a row of gate lines, the shift register unit of each row may perform pre-charging to the shift register unit of the next row at the same time of outputting the gate driving signal, so as to ensure the shift register unit of the next row realize output in the next clock period. In the prior art, as shown in FIG. 3, the shift register unit takes the simplest 4T1C structure as the example. When the H-Blank timing scanning as shown in FIG. 1 is performed, the N/2+1 row of shift register unit is the very beginning row of the second ½ display scanning, but its pull-up control PU node has been charged as a high level when the N/2 row provides an output. Since a relatively long scanning time exists between the outputs of the N/2 row and the N/2+1 row, electric leakage may occur to the potential of the PU point through the connected TFT, thereby affecting the pre-charging of the shift register unit of the N/2+1 row seriously, such that the voltage will be reduced when the shift register unit of the N/2+1 row performs output, thereby resulting in insufficient charging rate of the pixels of this row, and the defect of dark or bright line may occur.

SUMMARY OF THE INVENTION

The embodiment of the present invention provides a gate driving circuit and a driving method thereof, as well as a display device, which can avoid insufficient charging rate of the row of pixels, and improve dark or bright line defects.

In order to achieve the above object, the embodiment of the present invention adopts the following technical solutions:

One aspect of the embodiment of the present invention provides a gate driving circuit, comprising:

a plurality of mutually cascaded shift register units located in a first region and a second region respectively, except for a first stage of shift register unit of the first region, a signal output terminal of each of the other shift register units is connected to a reset signal terminal of a previous stage of shift register unit adjacent to it, and except for the last stage of shift register unit of the second region, a signal output terminal of each of the other shift register units is connected to a signal input terminal of a next stage of shift register unit adjacent to it; and a pre-charging unit connected to a first stage of shift register unit of the second region, wherein gate row drive scanning and touch control scanning of the plurality of mutually cascaded shift register units are performed alternately, and the pre-charging unit is used for pre-charging the first stage of shift register unit of the second region during the touch control scanning.

On the other aspect, the embodiment of the present invention further provides a method for driving a gate driving circuit as stated above, the method comprising:

performing gate row drive scanning to the shift register units located in the first region in the gate driving circuit;

performing touch control scanning after the gate row drive scanning of the shift register units located in the first region is accomplished, performing pre-charging to the first stage of shift register unit of the second region during the touch control scanning; and performing gate row drive scanning to the shift register units located in the second region in the gate driving circuit.

In addition, the embodiment of the present invention further provides a display device comprising a gate driving circuit as stated above.

The gate driving circuit and the driving method thereof, as well as the display device provided by the embodiment of the present invention, by additionally arranging a pre-charging unit connected with the corresponding first stage of shift register unit when the gate row drive scanning is performed again after the touch control scanning is accomplished, can pre-charge the first stage of shift register unit during the touch control scanning. In this way, the electric leakage phenomenon of the pull-up control node (PU point) of the corresponding first stage of shift register unit when the gate row drive scanning is performed again after the touch control scanning is accomplished due to a relatively long touch control scanning time interval between output of two rows of shift register units is avoided, thereby avoiding the defect of insufficient charging rate of row of pixels while ensuring touch control scanning of high report rate, which improves dark or bright line defects significantly and increases the display quality.

DETAILED DESCRIPTION OF THE INVENTION

Next, the technical solutions in embodiments of the present invention will be described clearly and completely by combining the drawings in embodiments of the present invention, apparently, the embodiments described are only part rather than all of the embodiments of the present invention. All the other embodiments obtained by the ordinary skilled person in the art based on the embodiments in the present invention belong to the protection scope of the present invention.

The transistors used in all the embodiments of the present invention may be thin film transistors or field effect transistors or other devices with the same characteristics. Since the source and the drain of the transistor used here are symmetric, its source and drain are the same from the perspective of the structure of the device. In the embodiments of the present invention, in order to distinguish the two poles other than the gate of the transistor, one pole thereof is called a first pole, and the other pole is called a second pole. In addition, the transistor can be classified into N-type and P-type according to the characteristic of the transistor, the following embodiments all take the N-type transistor as the example for explanation. When the N-type transistor is used, the first pole may be the source of the N-type transistor, and the second pole may be the drain of the N-type transistor. It can be conceived that using the P-type transistor for implementation is easily conceivable by the skilled person in the art without paying any creative work, and therefore it also falls within the protection scope of the embodiments of the present invention.

Figure 4:
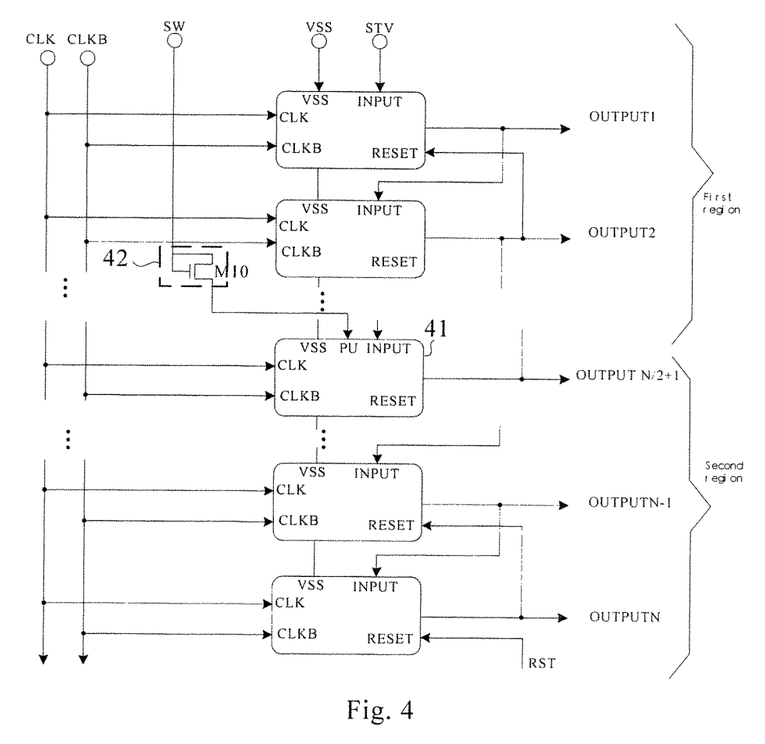
FIG. 4 is a structural schematic view of a gate driving circuit provided by an embodiment of the present invention.

The gate driving circuit provided by an embodiment of the present invention, as shown in FIG. 4, comprises a plurality of mutually cascaded shift register units 41 located in a first region and a second region respectively, as well as a pre-charging unit 42.

Wherein, except for a first stage of shift register unit of the first region, a signal output terminal OUTPUT of each of the other shift register units 41 is connected to a reset signal terminal RESET of a previous stage of shift register unit 41 adjacent to it.

Except for the last stage of shift register unit of the second region, a signal output terminal OUTPUT of each of the other shift register units 41 is connected to a signal input terminal INPUT of a next stage of shift register unit 41 adjacent to it.

The gate row drive scanning and the touch control scanning of the plurality of mutually cascaded shift register units 41 are performed alternately. The pre-charging unit 42 is connected to the first stage of shift register unit of the second region (i.e., the corresponding first stage of shift register unit when the gate row drive scanning is performed again after the touch control scanning is accomplished), for pre-charging the first stage of shift register unit 41 of the second region during the touch control scanning.

The gate driving circuit provided by the embodiment of the present invention, by additionally arranging a pre-charging unit connected with the corresponding first stage of shift register unit when the gate row drive scanning is performed again after the touch control scanning is accomplished, can pre-charge the first stage of shift register unit during the touch control scanning. In this way, the electric leakage phenomenon of the pull-up control node (PU point) of the corresponding first stage of shift register unit when the gate row drive scanning is performed again after the touch control scanning is accomplished due to a relatively long touch control scanning time interval between outputs of two rows of shift register units is avoided, thereby avoiding the defect of insufficient charging rate of row of pixels while ensuring touch control scanning of high report rate, which improves dark or bright line defects significantly and increases the display quality.

It should be noted that in the process of performing gate row drive scanning and touch control scanning to an array substrate with N rows of gate lines, in order to improve accuracy and report rate of the touch control scanning, increasing the touch control scanning frequency is the key, which requires adding multiple touch control scanning in the process of one gate row drive scanning. A period of time may be preserved to perform partial touch signal scanning in the interval of charging a certain number of rows of pixels, i.e., the pixel charging and the touch control scanning are performed alternately. Such a mode can support the touch control scanning refresh rate to be larger than the screen refresh rate, i.e., in multiple relationship with the screen refresh rate.

Specifically, in the gate driving circuit as shown in FIG. 4, the array substrate is equally divided into two regions with the same number of rows of gate lines for explanation, wherein the region where the previous N/2 rows of gate lines are located is called a first region, the region where the latter N/2 rows of gate lines are located are called a second region, the period of time after the scanning of the first region is accomplished and before the scanning of the second region starts is the touch control scanning time. The pre-charging unit 42 is used for performing pre-charging to the first stage of shift register unit 41 located in the second region during the touch control scanning. Of course, the above is only an illustration, in order to further increase the refresh rate of the touch control scanning, the gate lines on the array substrate can be divided into more regions for scanning, the present invention does not make definition on this.

Figure 5:
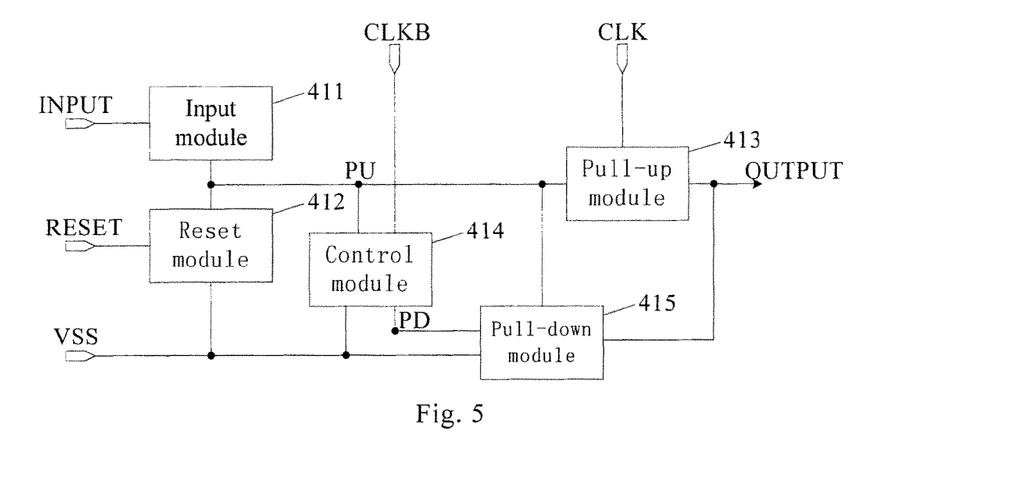
FIG. 5 is a structural schematic view of a shift register unit in a gate driving circuit provided by an embodiment of the present invention.

Further, as shown in FIG. 5, the shift register unit 41 may comprise: an input module 411, a reset module 412, a pull-up module 413, a control module 414 and a pull-down module 415.

Wherein, the input module 411 is connected to the signal input terminal INPUT and the pull-up control node (PU point), for controlling the level of the pull-up control node (PU point) based on the signal inputted by the signal input terminal INPUT, the pull-up control node (PU point) is the connection point of the input module 411 and the pull-up module 413.

The reset module 412 is connected to the reset signal terminal RESET, a voltage terminal VSS and the pull-up control node (PU point), for controlling the level of the pull-up control node (PU point) based on the signal inputted by the reset signal terminal RESET.

The pull-up module 413 is connected to a first clock signal input terminal CLK, the pull-up control node (PU point) and the signal output terminal OUTPUT, for pulling up the signal outputted by the signal output terminal OUTPUT to a high level based on the pull-up control node (PU point) and the clock signal inputted by the first clock input terminal CLK.

The control module 414 is connected to a second clock signal input terminal CLKB, the voltage terminal VSS, the pull-up control node (PU point) and the pull-down control node (PD point), for controlling the level of the pull-down control node (PD point) based on the clock signal inputted by the second clock signal input terminal CLKB and the level of the pull-up control node (PU point).

The pull-down module 415 is connected to the pull-up control node (PU point), the pull-down control node (PD point), the voltage terminal VSS and the signal output terminal OUTPUT, for pulling down the signal outputted by the signal output terminal OUTPUT to a low level.

Wherein the voltage terminal VSS may be a low level input. The clock signals inputted by the first clock signal terminal CLK and the second clock signal terminal CLKB are both square wave clock signals and have the same period and duty ratio, however, the phases of the two clock signals are opposite, i.e., when the CLK inputs a high level, the CLKB inputs a low level.

Figure 6:
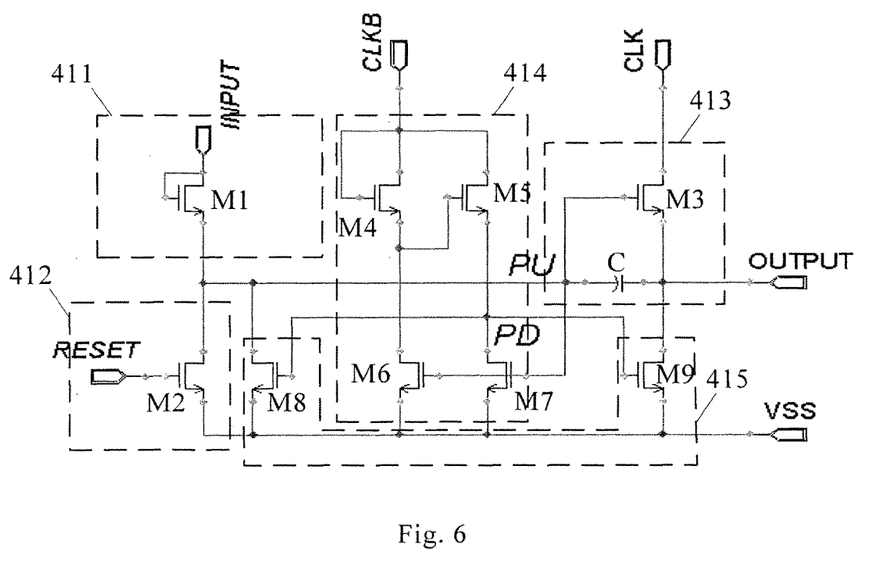
FIG. 6 is a structural schematic view of circuit connection of a shift register unit provided by an embodiment of the present invention.

Further, the specific structure of the shift register unit provided by the embodiment of the present invention may be as shown in FIG. 6, wherein the input module 411 may comprise:

A first transistor M1, a first pole thereof being connected to the pull-up control node (PU point), a second pole and a gate thereof being both connected to the signal input terminal INPUT.

The reset module 412 may comprise:

A second transistor M2, a first pole thereof being connected to the voltage terminal VSS, a gate thereof being connected to the reset signal terminal RESET, a second pole thereof being connected to the pull-up control node (PU point).

In the embodiment of the present invention, the pull-up control node (PU point) refers to a circuit node that controls the pull-up module 413 to be in an ON or OFF state. The functions of the input module 411 and the reset module 412 are specifically determining the level of the pull-up control node (PU point) based on the different levels of the signal input terminal INPUT and the reset signal terminal RESET, thereby determining whether the shift register unit is in an output or a reset state currently.

The input module 411 and the reset module 412 in such a structure can realize gate row drive unidirectional scanning from top to bottom. Specifically, when the output terminal OUTPUT of the previous stage of shift register unit outputs a signal, the output signal will be inputted to the input terminal INPUT of the current stage of shift register unit, thereby realizing pre-charging of the pull-up control node (PU point) of the current stage, and realizing output of the OUTPUT terminal of the current stage of shift register unit when the next clock period comes. The output signal of the current stage of shift register unit is also inputted to the RESET terminal of the previous stage of shift register unit and the INPUT terminal of the next stage of shift register unit at the same time, to realize reset of the previous stage of shift register unit and pre-charging of the pull-up control node (PU point) of the next stage of shift register unit, by analogy, to realize unidirectional stage by stage scanning from top to bottom finally.

Further, as shown in FIG. 6, the pull-up module 413 may comprise:

A third transistor M3, a first pole thereof being connected to the signal output terminal OUTPUT, a gate thereof being connected to the pull-up control node (PU point), a second pole thereof being connected to the first clock signal input terminal CLK.

A capacitor C, the capacitor C is connected in parallel between the gate of the third transistor M3 and the first pole of the third transistor M3.

In the embodiment of the present invention, the function of the pull-up module 413 is enabling the signal output terminal OUTPUT to output a high level signal for gate driving after performing the pre-charging and within the clock period in which the clock signal inputted by the first clock signal input terminal CLK is of a high level.

Further, as shown in FIG. 6, the control module 414 may comprise:

A fourth transistor M4, a gate and a second pole thereof being both connected to the second clock signal input terminal CLKB.

A fifth transistor M5, a gate thereof being connected to the first pole of the fourth transistor M4, a second pole thereof being connected to the second clock signal input terminal CLKB.

A sixth transistor M6, a first pole thereof being connected to the voltage terminal VSS, a gate thereof being connected to the pull-up control node (PU point), a second pole thereof being connected to the first pole of the fourth transistor M4;

A seventh transistor M7, a first pole thereof being connected to the voltage terminal VSS, a gate thereof being connected to the pull-up control node (PU point), a second pole thereof being connected to the pull-down control node (PD point).

In the embodiment of the present invention, the function of the control module 414 is controlling the level of the pull-down control node (PD point) based on the voltage of the pull-up control node (PU point), wherein the pull-down control node (PD point) refers to a circuit node that controls the pull-down module to be in an ON or OFF state.

Further, as shown in FIG. 6, the pull-down module 415 may comprise:

An eighth transistor M8, a first pole thereof being connected to the voltage terminal VSS, a gate thereof being connected to the pull-down control node (PD point), a second pole thereof being connected to the pull-up control node (PU point).

A ninth transistor M9, a first pole thereof being connected to the voltage terminal VSS, a gate thereof being connected to the pull-down control node (PD point), a second pole thereof being connected to the signal output terminal OUTPUT.

In the embodiment of the present invention, the function of the pull-down module 415 is specifically pulling down the potential of the pull-up control node (PU point) and the signal output terminal OUTPUT respectively when the potential of the pull-down control node (PD point) is high and when the clock signal is of a low level.

The shift register unit as shown in FIG. 6 comprises nine N-type transistors and a capacitor (9T1C) respectively, compared with the commonly used shift register unit at present, there are relatively less components in such a circuit structure design, thereby significantly simplifying the circuit design and the production difficulty, effectively controlling the size of the circuit area and the wiring space, and realizing the narrow frame design of the display device.

In the embodiment of the present invention, as shown in FIG. 4, the pre-charging unit 42 is connected to the charge signal input terminal SW and the pull-up control node (PU point) of the first stage of shift register unit 41 located in the second region respectively.

Specifically, as shown in FIG. 4, the pre-charging unit 42 may comprise:

A tenth transistor M10, a first pole thereof being connected to the pull-up control node (PU point) of the first stage of shift register unit 41 of the second region, a gate and a second pole thereof being connected to the charge signal input terminal SW.

Figure 7:
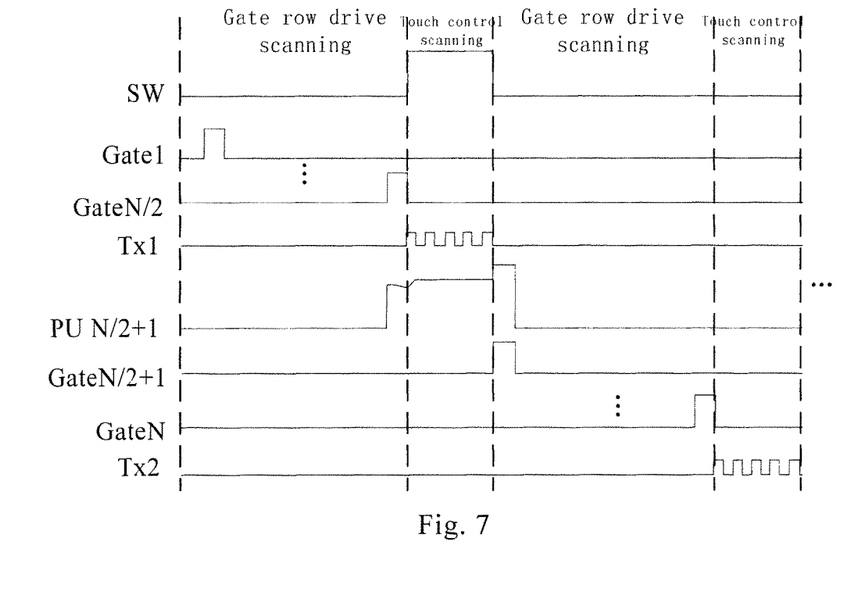
FIG. 7 is a waveform diagram of signal timing of a gate driving circuit provided by an embodiment of the present invention in operation.

From the analysis of the prior art it can be seen that because the N/2+1 th shift register unit is the first shift register unit after the touch control scanning, its pull-up control node (PU point) may be attenuated, therefore, an additional SW signal is introduced, which is set as a high level in touch control scanning, so that the pull-up control node (PU point) of the N/2+1 can remain at a high level, thereby ensuring normal output. From FIG. 7 it can be seen that under the effect of the SW signal, both the pull-up control node (PU point) and the output signal of the N/2+1 th stage of shift register unit can remain normal, the attenuation phenomenon does not occur and the expected effect is achieved. The function of the transistor M10 therein is unidirectional conduction, i.e., when the SW is of a high level, the level inputted to the pull-up control node (PU point) of the N/2+1 th stage of shift register unit is high, when the SW is of a low level, the level inputted to the pull-up control node (PU point) of the N/2+1 th stage of shift register unit is low. It should be understood that the transistor M10 is only an example of the pre-charging unit, the pre-charging unit is not limited to the transistor M10. For example, the pre-charging unit may also comprise a plurality of transistors. Actually, any circuits or electronic components that can realize the pre-charging function can be used. For example, the pre-charging unit specifically can be realized through thin film transistor technology, and can also be realized through control of an integrated circuit IC, or through other circuit structures. Of course, the design of using the transistor M10 can further simplify the circuit structure.

In the embodiment of the present invention, as shown in FIG. 4, the signal input terminal INPUT of the first stage of shift register unit of the first region can input a frame start signal STV; the reset signal terminal RESET of the last stage of shift register unit of the second region can input a reset signal RST.

The gate driving circuit as shown in FIG. 4, by additionally arranging a pre-charging unit connected with the corresponding first stage of shift register unit when the gate row drive scanning is performed again after the touch control scanning is accomplished, can pre-charge the first stage of shift register unit during the touch control scanning. In this way, the electric leakage phenomenon of the pull-up control node (PU point) of the corresponding first stage of shift register unit when the gate row drive scanning is performed again after the touch control scanning is accomplished due to a relatively long touch control scanning time interval between outputs of two rows of shift register units is avoided, thereby avoiding the defect of insufficient charging rate of row of pixels while ensuring touch control scanning of high report rate, which improves dark or bright line defects significantly and increases the display quality.

Figure 8:
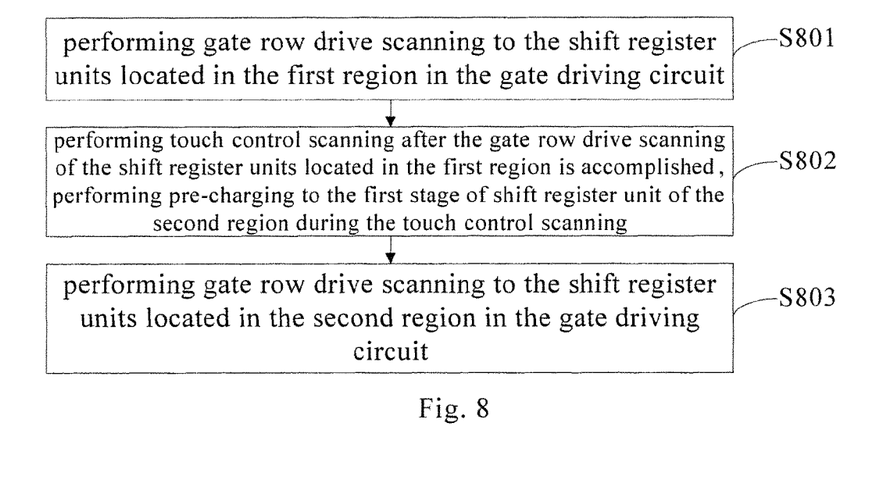
FIG. 8 is a flow chart of a driving method of a gate driving circuit provided by an embodiment of the present invention.

Corresponding to the gate driving circuit, an embodiment of the present invention further provides a driving method of a gate driving circuit, which can be applied in the gate driving circuit as stated above, as shown in FIG. 8, comprising:

S801, performing gate row drive scanning to the shift register units located in the first region in the gate driving circuit.

S802, performing touch control scanning after the gate row drive scanning of the shift register units located in the first region is accomplished, performing pre-charging to the first stage of shift register unit of the second region during the touch control scanning.

S803, performing gate row drive scanning to the shift register units located in the second region in the gate driving circuit.

The driving method of the gate driving circuit provided by the embodiment of the present invention, by additionally arranging a pre-charging unit connected with the corresponding first stage of shift register unit when the gate row drive scanning is performed again after the touch control scanning is accomplished, can pre-charge the first stage of shift register unit during the touch control scanning. In this way, the electric leakage phenomenon of the pull-up control node (PU point) of the corresponding first stage of shift register unit when the gate row drive scanning is performed again after the touch control scanning is accomplished due to a relatively long touch control scanning time interval between outputs of two rows of shift register units is avoided, thereby avoiding the defect of insufficient charging rate of row of pixels while ensuring touch control scanning of high report rate, which improves dark or bright line defects significantly and increases the display quality.

It should be noted that in the process of performing gate row drive scanning and touch control scanning to the array substrate with N rows of gate lines, in order to improve accuracy and report rate of the touch control scanning, increasing the touch control scanning frequency is the key, which requires adding multiple touch control scanning in the process of one gate row drive scanning. A period of time may be preserved to perform partial touch signal scanning in the interval of charging a certain number of rows of pixels, i.e., the pixel charging and the touch control scanning are performed alternately. Such a mode can support the touch control scanning refresh rate to be larger than the screen refresh rate, i.e., in multiple relationship with the screen refresh rate.

Specifically, in the gate driving circuit as shown in FIG. 4, the array substrate is equally divided into two regions with the same number of rows of gate lines for explanation, wherein the region where the previous N/2 rows of gate lines are located is called a first region, the region where the latter N/2 rows of gate lines are located are called a second region, the period of time after the scanning of the first region is accomplished and before the scanning of the second region starts is the touch control scanning time. The pre-charging unit 42 is used for performing pre-charging to the first stage of shift register unit 41 located in the second region during the touch control scanning. Of course, the above is only an illustration, in order to further increase the refresh rate of the touch control scanning, the gate lines on the array substrate can be divided into more regions for scanning, the present invention does not make definition on this.

Wherein, the structure of the shift register unit specifically may be as shown in FIG. 6, which will not be repeated here. Further, as shown in FIG. 4, the first stage of shift register unit of the second region is pre-charged by the pre-charging unit 42.

Specifically, performing pre-charging to the first stage of shift register unit of the second region during the touch control scanning may comprise:

inputting a charge signal of a high level to the pull-up control node of the first stage of shift register unit of the second region during the touch control scanning; and stopping inputting the charge signal to the pull-up control node of the first stage of shift register unit of the second region during performing gate row drive scanning to the shift register units located in the second region in the gate driving circuit.

For example, the pre-charging unit 42 may comprise a transistor M10, the first pole thereof being connected to the pull-up control node (PU point) of the first stage of shift register unit 41 of the second region, the gate and the second pole thereof being connected to the charge signal input terminal. When performing touch control scanning, the SW signal inputs a high level to the pull-up control node (PU point) of the first stage of shift register unit located in the second region by turning on the transistor M10, when performing gate row drive scanning, the SW signal will turn off the transistor M10 and stop inputting the charge signal to the pull-up control node (PU point) of the first stage of shift register unit located in the second region.

It should be understood that the transistor M10 is only an example of the pre-charging unit, the pre-charging unit is not limited to the transistor M10. For example, the pre-charging unit may also comprise a plurality of transistors. Actually, any circuits or electronic components that can realize the pre-charging function can be used. For example, the pre-charging unit specifically can be realized through thin film transistor technology, and can also be realized through control of an integrated circuit IC, or through other circuit structures. Of course, the design of using the transistor M10 can further simplify the circuit structure. In addition, an embodiment of the present invention further provides a display device comprising a gate driving circuit as stated above.

Since the structure of the gate driving circuit has been described in detail in the preceding embodiments, it will not be repeated here.

The display device provided by the embodiment of the present invention comprises a gate driving circuit, the gate driving circuit further comprises shift register units, by additionally arranging a pre-charging unit connected with the corresponding first stage of shift register unit when the gate row drive scanning is performed again after the touch control scanning is accomplished, the first stage of shift register unit can be pre-charged during the touch control scanning. In this way, the electric leakage phenomenon of the pull-up control node (PU point) of the corresponding first stage of shift register unit when the gate row drive scanning is performed again after the touch control scanning is accomplished due to a relatively long touch control scanning time interval between outputs of two rows of shift register units is avoided, thereby avoiding the defect of insufficient charging rate of row of pixels while ensuring touch control scanning of high report rate, which improves dark or bright line defects significantly and increases the display quality.

The ordinary skilled person in the art can understand that all or part of the steps for implementing the above method embodiment can be performed by related hardware instructed by a program, the preceding program may be stored in a computer readable storage medium, when the program is executed, the steps of the method embodiment are performed; and the storage medium comprises: various mediums, such as ROM, RAM, diskette or optical disk etc., that can store program codes.

What is stated above are only specific implementing modes of the present invention, however, the protection scope of the present invention is not limited to this, any modifications or replacements that can be easily conceived by the skilled person familiar with the present technical field within the technical scope disclosed by the present invention should be covered within the protection scope of the present invention. Therefore, the protection scope of the present invention should be based on the protection scope of the claims.

The invention claimed is:

1. A gate driving circuit, characterized in that, comprising:
a plurality of mutually cascaded shift register units located in a first region and a second region respectively, except for a first stage of shift register unit of the first region, a signal output terminal of each of the other shift register units is connected to a reset signal terminal of a previous stage of shift register unit adjacent to it, and except for the last stage of shift register unit of the second region, a signal output terminal of each of the other shift register units is connected to a signal input terminal of a next stage of shift register unit adjacent to it; and a pre-charging unit connected to a first stage of shift register unit of the second region, wherein gate row drive scanning and touch control scanning of the plurality of mutually cascaded shift register units are performed alternately, and the pre-charging unit is used for pre-charging the first stage of shift register unit of the second region during the touch control scanning.

2. The gate driving circuit according to claim 1, characterized in that the shift register unit comprises an input module, a reset module, a pull-up module, a control module and a pull-down module;

the input module is connected to a signal input terminal and a pull-up control node, for controlling a level of the pull-up control node based on a signal inputted by the signal input terminal, the pull-up control node is a connection point of the input module and the pull-up module;

the reset module is connected to a reset signal terminal, a voltage terminal and the pull-up control node, for controlling the level of the pull-up control node based on a signal inputted by the reset signal terminal;

the pull-up module is connected to a first clock signal input terminal, the pull-up control node and a signal output terminal, for pulling up a signal outputted by the signal output terminal to a high level based on the pull-up control node and a clock signal inputted by the first clock signal input terminal;

the control module is connected to a second clock signal input terminal, the voltage terminal, the pull-up control node and a pull-down control node, for controlling a level of the pull-down control node based on a clock signal inputted by the second clock signal input terminal and the level of the pull-up control node;

the pull-down module is connected to the pull-up control node, the pull-down control node, the voltage terminal and the signal output terminal, for pulling down a signal outputted by the signal output terminal to a low level.

3. The gate driving circuit according to claim 2, characterized in that the input module comprises:

a first transistor, a first pole of the first transistor being connected to the pull-up control node, a second pole and a gate of the first transistor being both connected to the signal input terminal.

4. The gate driving circuit according to claim 2, characterized in that the reset module comprises:

a second transistor, a first pole of the second transistor being connected to the voltage terminal, a gate of the second transistor being connected to the reset signal terminal, a second pole of the second transistor being connected to the pull-up control node.

5. The gate driving circuit according to claim 2, characterized in that the pull-up module comprises:

a third transistor, a first pole of the third transistor being connected to the signal output terminal, a gate of the third transistor being connected to the pull-up control node, a second pole of the third transistor being connected to the first clock signal input terminal; and a capacitor, the capacitor being connected in parallel between the gate of the third transistor and the first pole of the third transistor.

6. The gate driving circuit according to claim 2, characterized in that the control module comprises:

a fourth transistor, a gate and a second pole of the fourth transistor being both connected to the second clock signal input terminal;

a fifth transistor, a gate of the fifth transistor being connected to a first pole of the fourth transistor, a second pole of the fifth transistor being connected to the second clock signal input terminal;

a sixth transistor, a first pole of the sixth transistor being connected to the voltage terminal, a gate of the sixth transistor being connected to the pull-up control node, a second pole of the sixth transistor being connected to the first pole of the fourth transistor;

a seventh transistor, a first pole of the seventh transistor being connected to the voltage terminal, a gate of the seventh transistor being connected to the pull-up control node, a second pole of the seventh transistor being connected to the pull-down control node.

7. The gate driving circuit according to claim 2, characterized in that the pull-down module comprises:

an eighth transistor, a first pole of the eighth transistor being connected to the voltage terminal, a gate of the eighth transistor being connected to the pull-down control node, a second pole of the eighth transistor being connected to the pull-up control node;

a ninth transistor, a first pole of the ninth transistor being connected to the voltage terminal, a gate of the ninth transistor being connected to the pull-down control node, a second pole of the ninth transistor being connected to the signal output terminal.

8. The gate driving circuit according to claim 2, characterized in that the pre-charging unit is connected to a charge signal input terminal and a pull-up control node of the first stage of shift register unit of the second region respectively.

9. The gate driving circuit according to claim 1, characterized in that the pre-charging unit is connected to a charge signal input terminal and a pull-up control node of the first stage of shift register unit of the second region respectively.

10. The gate driving circuit according to claim 9, characterized in that the pre-charging unit comprises:

a tenth transistor, a first pole of the tenth transistor being connected to the pull-up control node of the first stage of shift register unit of the second region, a gate and a second pole of the tenth transistor being connected to the charge signal input terminal.

11. The gate driving circuit according to claim 1, characterized in that the signal input terminal of the first stage of shift register unit of the first region inputs a frame start signal; the reset signal terminal of the last stage of shift register unit of the second region inputs a reset signal.

12. A method for driving a gate driving circuit, the gate driving circuit comprising: a plurality of mutually cascaded shift register units located in a first region and a second region respectively, except for a first stage of shift register unit of the first region, a signal output terminal of each of the other shift register units is connected to a reset signal terminal of a previous stage of shift register unit adjacent to it, and except for the last stage of shift register unit of the second region, a signal output terminal of each of the other shift register units is connected to a signal input terminal of a next stage of shift register unit adjacent to it; and a pre-charging unit connected to a first stage of shift register unit of the second region, characterized in that the method comprises:

performing gate row drive scanning to the shift register units located in the first region in the gate driving circuit;

performing touch control scanning after the gate row drive scanning of the shift register units located in the first region is accomplished, performing pre-charging to the first stage of shift register unit of the second region during the touch control scanning; and performing gate row drive scanning to the shift register units located in the second region in the gate driving circuit.

13. The method for driving a gate driving circuit according to claim 12, characterized in that performing pre-charging to the first stage of shift register unit of the second region during the touch control scanning comprises:

inputting a charge signal of a high level to a pull-up control node of the first stage of shift register unit of the second region during the touch control scanning;

stopping inputting the charge signal to the pull-up control node of the first stage of shift register unit of the second region during performing gate row drive scanning to the shift register units located in the second region in the gate driving circuit.

14. A display device, characterized in that, comprising a gate driving circuit, the gate driving circuit comprising:

a plurality of mutually cascaded shift register units located in a first region and a second region respectively, except for a first stage of shift register unit of the first region, a signal output terminal of each of the other shift register units is connected to a reset signal terminal of a previous stage of shift register unit adjacent to it, and except for the last stage of shift register unit of the second region, a signal output terminal of each of the other shift register units is connected to a signal input terminal of a next stage of shift register unit adjacent to it; and a pre-charging unit connected to a first stage of shift register unit of the second region, wherein gate row drive scanning and touch control scanning of the plurality of mutually cascaded shift register units are performed alternately, and the pre-charging unit is used for pre-charging the first stage of shift register unit of the second region during the touch control scanning.

15. The gate driving circuit according to claim 8, characterized in that the pre-charging unit comprises:

a tenth transistor, a first pole of the tenth transistor being connected to the pull-up control node of the first stage of shift register unit of the second region, a gate and a second pole of the tenth transistor being connected to the charge signal input terminal.

* * * * *